United States Patent
Kang et al.

(10) Patent No.: US 9,761,746 B2
(45) Date of Patent: Sep. 12, 2017

(54) LOW VOLTAGE AVALANCHE PHOTODIODE WITH RE-ENTRANT MIRROR FOR SILICON BASED PHOTONIC INTEGRATED CIRCUITS

(71) Applicants: Yimin Kang, San Jose, CA (US); Han-Din D. Liu, San Jose, CA (US); Ansheng Liu, Cupertino, CA (US)

(72) Inventors: Yimin Kang, San Jose, CA (US); Han-Din D. Liu, San Jose, CA (US); Ansheng Liu, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/976,369

(22) PCT Filed: Mar. 11, 2013

(86) PCT No.: PCT/US2013/030288
§ 371 (c)(1),
(2) Date: Jun. 26, 2013

(87) PCT Pub. No.: WO2014/142795
PCT Pub. Date: Sep. 18, 2014

(65) Prior Publication Data
US 2014/0252411 A1 Sep. 11, 2014

(51) Int. Cl.
*H01S 5/02* (2006.01)
*H01L 31/107* (2006.01)
(Continued)

(52) U.S. Cl.
CPC ...... *H01L 31/028* (2013.01); *H01L 31/02327* (2013.01); *H01L 31/105* (2013.01);
(Continued)

(58) Field of Classification Search
CPC .......... G02B 6/12; G02B 6/26; H01L 31/107; H01L 31/18; H01L 21/306
(Continued)

(56) References Cited

U.S. PATENT DOCUMENTS 4,083,062 A 4/1978 Ohuchi et al.
5,260,588 A 11/1993 Ohta et al.
(Continued)

FOREIGN PATENT DOCUMENTS

CN 1905216 A 1/2007
CN 101191871 A 6/2008
(Continued)

OTHER PUBLICATIONS

PCT/US2013/030288 Notification of Transmittal of the International Search Report and the Written Opinion of the International Searching Authority, or the Declaration, mailed Dec. 6, 2013, 10 pages.
(Continued)

*Primary Examiner* — Kimberly Rizkallah
*Assistant Examiner* — Brian Turner
(74) *Attorney, Agent, or Firm* — Blakely, Sokoloff, Taylor & Zafman LLP (57) ABSTRACT

A low voltage APD is disposed at an end of a waveguide extending laterally within a silicon device layer of a PIC chip. The APD is disposed over an inverted re-entrant mirror co-located at the end of the waveguide to couple light by internal reflection from the waveguide to an under side of the APD. In exemplary embodiments, a 45°-55° facet is formed in the silicon device layer by crystallographic etch. In embodiments, the APD includes a silicon multiplication layer, a germanium absorption layer over the multiplication layer, and a plurality of ohmic contacts disposed over the absorption layer. An overlying optically reflective metal film
(Continued)

interconnects the plurality of ohmic contacts and returns light transmitted around the ohmic contacts to the absorption layer for greater detector responsivity.

15 Claims, 7 Drawing Sheets

(51) Int. Cl.
| | |
|---|---|
| H01L 31/028 | (2006.01) |
| H01L 31/0232 | (2014.01) |
| G02B 6/26 | (2006.01) |
| H01L 35/24 | (2006.01) |
| G02B 6/12 | (2006.01) |
| H01L 31/105 | (2006.01) |
| H01L 31/18 | (2006.01) |

(52) U.S. Cl.
CPC ........ *H01L 31/107* (2013.01); *H01L 31/1804* (2013.01); *Y02E 10/547* (2013.01)

(58) Field of Classification Search
USPC ................ 257/233, 436, 616, 432, E25.032; 385/129, 131
See application file for complete search history.

(56) References Cited

U.S. PATENT DOCUMENTS

| | | | |
|---|---|---|---|
| 6,002,700 A * | 12/1999 | Sato ........................... | 372/45.01 |
| 6,323,480 B1 | 11/2001 | Tran et al. | |
| 6,359,322 B1 | 3/2002 | Haralson et al. | |
| 6,483,098 B1 | 11/2002 | Kato et al. | |
| 6,858,829 B2 | 2/2005 | Nishimura et al. | |
| 7,366,380 B1 | 4/2008 | Peterson et al. | |
| 7,397,101 B1 | 7/2008 | Masini et al. | |
| 8,435,809 B2 | 5/2013 | Heck et al. | |
| 2002/0135035 A1 | 9/2002 | Yamaguchi et al. | |
| 2003/0098490 A1 | 5/2003 | Detai et al. | |
| 2004/0022496 A1 | 2/2004 | Lam | |
| 2004/0129935 A1* | 7/2004 | Blauvelt ............... | G02B 6/4204 257/40 |
| 2004/0156576 A1 | 8/2004 | Windover | |
| 2004/0251483 A1 | 12/2004 | Ko et al. | |
| 2005/0117844 A1 | 6/2005 | Abeles et al. | |
| 2006/0251375 A1* | 11/2006 | Morse ........................... | 385/141 |
| 2006/0289951 A1 | 12/2006 | Weimer | |
| 2006/0289957 A1* | 12/2006 | Morse et al. ................ | 257/438 |
| 2008/0175527 A1 | 7/2008 | Black et al. | |
| 2008/0175531 A1* | 7/2008 | Fincato et al. ................ | 385/14 |
| 2009/0026494 A1 | 1/2009 | Itzler | |
| 2009/0220191 A1 | 9/2009 | Evans et al. | |
| 2009/0242934 A1* | 10/2009 | Hu ............................... | 257/186 |
| 2010/0038736 A1* | 2/2010 | Assefa et al. ................ | 257/432 |
| 2010/0327385 A1* | 12/2010 | Shiba et al. .................. | 257/432 |
| 2011/0012221 A1 | 1/2011 | Fujikata et al. | |
| 2011/0147874 A1 | 6/2011 | Nagarajan et al. | |
| 2011/0156183 A1 | 6/2011 | Liu | |
| 2012/0006980 A1* | 1/2012 | Alieu et al. .................... | 250/216 |
| 2012/0126286 A1 | 5/2012 | Na et al. | |
| 2012/0147917 A1* | 6/2012 | Oki ........................ | B82Y 20/00 372/45.013 |
| 2012/0326259 A1* | 12/2012 | Huang ................ | H01L 31/1075 257/438 |
| 2013/0039614 A1 | 2/2013 | Shubin et al. | |
| 2013/0299932 A1 | 11/2013 | Heck et al. | |
| 2013/0320478 A1* | 12/2013 | JangJian ............... | H01L 31/103 257/460 |
| 2014/0003766 A1 | 1/2014 | Heck et al. | |

FOREIGN PATENT DOCUMENTS

| | | |
|---|---|---|
| EP | 0908747 | 4/1999 |
| JP | 04-343484 A | 11/1992 |
| JP | 08-046292 A | 2/1996 |
| JP | 11-191654 A | 7/1999 |
| TW | 550964 B | 9/2003 |
| TW | 200736682 A | 10/2007 |
| WO | 2011/037742 A2 | 3/2011 |
| WO | 2011/037742 A3 | 3/2011 |
| WO | 2013/101110 A1 | 7/2013 |
| WO | 2014/004068 A2 | 1/2014 |
| WO | 2014/004068 A3 | 1/2014 |

OTHER PUBLICATIONS

Related PCT Patent Application No. PCT/US2011/067934 Notification of Transmittal of the International Search Report and the Written Opinion of the International Searching Authority, or the Declaration, mailed Sep. 14, 2012, 10 pages.
Related Patent Application No. PCT/US2010/047987 Notification of Transmittal of the International Search Report and the Written Opinion of the International Searching Authority, or the Declaration, mailed May 2, 2011, 9 pages.
Office Action with English Translation from related Chinese Patent Application No. 201010294280.3 mailed Jul. 31, 2012, 9 pages.
Office Action with English translation from related Taiwan Patent Application No. 099130503 dated Sep. 11, 2013, 9 pages.
Related Patent Application No. PCT/US2010/047987 International Preliminary Report on Patentability, mailed Apr. 5, 2012, 7 pages.
Office Action from related Korean Patent Application No. 2012-7007505, mailed May 24, 2013, 2 pages of English translation only.
Related PCT Patent Application No. PCT/US2013/045027 Notification of Transmittal of the International Search Report and the Written Opinion of the International Searching Authority, or the Declaration, mailed Nov. 26, 2013, 11 pages.
"Anisotropic Etching of Surfactant-Added TMAH Solution," by Masayuki Sekimura, Mechanical Systems Research Laboratories, Toshiba Corp., dated 1999, from IEEE, 6 pages.
"Alignment Insensitive Anisotropic Etching of Silicon Cavities with Smooth 49 Degree Sidewalls," by C. Shen, H.T.M. Pham, and P.M. Sarro, Delft University of Technology, DIMES-ECTM, Delft, the Netherlands, from Transducers, Jun. 21-25, 2009, 4 pages.
"Fabrication of 45 Degree Mirrors Together with Well-Defined V-Grooves Using Wet Anisotropic Etching of Silicon," by Carola Strandman, Lars Rosengren, Hakan G. A. Elderstig, and Ylva Backlund from Journal of Microelectromechanical Systems, vol. 4, No. 4, Dec. 1995, 7 pages.
"Silicon Anisotropic Etching in Alkaline Solutions III: On the Possibility of Spatial Structures Forming in the Course of Si (100) Anisotropic Etching in KOH and KOH + IPA Solutions" by Irena Zubel, from Sensors and Actuators 84 (2000) 116-125, 10 pages.
Taiwan Appln. No. 103104736 Official Letter/Search Report, May 25 2015, 18 pgs.
International Preliminary Report on Patentability for PCT/US2013/030288, mailed Oct. 5, 2015, 7 pages.
Taiwan (R.O.C.) Patent Application No. 103104736, Notice of Allowance and Allowed Claims mailed Dec. 21, 2015, (with English translation), (16 pages).
Korea, Republic of Korea, Patent Application No. 2015-7021579, Notice of Preliminary Rejection dated Mar. 17, 2016, (with English translation), (19 pages).
W.S. Zaoui et al., "Frequency response and bandwidth enhancement in Ge/Si avalanche photodiodes with over 860GHz gain-bandwidth-product", Optics Express, 2009, vol. 17, No. 15, pp. 12641-12649 (published on Jul. 10, 2009), (6 pages).
Taiwan (R.O.C.) Patent Application No. 103104736, Notice of Allowance and Allowed Claims mailed Dec. 21, 2015, (with English translation) 16 pages.
Chinese Office Action for Counterpart Chinese Patent Application No. 201380072738.2 dated Jan. 22, 2017 (No translation received).
Supplementary European Search Report and European Search Opinion for Patent Application 13877732.1 dated Nov. 3, 2016, 7 pages.

* cited by examiner

FIG. 5

LOW VOLTAGE AVALANCHE PHOTODIODE WITH RE-ENTRANT MIRROR FOR SILICON BASED PHOTONIC INTEGRATED CIRCUITS

STATEMENT OF GOVERNMENT INTEREST

This invention was made with Government support under contract number H98230-10-9-0021 awarded by the Department of Defense. The Government has certain rights in this invention.

CROSS-REFERENCE TO RELATED APPLICATIONS

This application is related to U.S. patent application Ser. No. 12/567,601, titled "VERTICAL MIRROR IN SILICON PHOTONIC CIRCUIT," and Ser. No. 13/536,723, titled "INVERTED 45 DEGREE MIRROR FOR PHOTONIC INTEGRATED CIRCUITS," and is related to PCT Application No. PCT/US2011/067934, titled "AVALANCHE PHOTODIODE WITH LOW BREAKDOWN VOLTAGE."

TECHNICAL FIELD

Embodiments of the invention are generally related to photonic integrated circuits (PICs), and more particularly pertain to avalanche photodiodes (APD) optically coupled to waveguides by minor facets.

BACKGROUND

Monolithically integrated photonic circuits are useful as optical data links in applications such as, but not limited to, optical communications, high performance computing, and data centers. For mobile computing platforms too, a PIC is a promising I/O for rapidly updating or syncing a mobile device with a host device and/or cloud service where a wireless link has insufficient bandwidth. Such optical links utilize an optical I/O interface that includes an optical transmitter and/or an optical receiver, at least one of which utilizes a photodetector, typically a photodiode.

Avalanche Photodiodes (APD) are useful in applications where high sensitivity is desired. Such applications include long haul fiber-optic telecommunication, laser rangefinder, and single photon level detection and imaging, among other applications. Hybrid silicon/germanium (Si/Ge) APD architectures offer promising applications targeted at near-infrared optical signals. In a Si/Ge Separate Absorption, Charge, and Multiplication (SACM) APD, Ge offers high responsivity at near-infrared wavelengths, while Si is used to amplify photo-generated carriers with low noise. In addition, Si/Ge based APDs have potential to reduce costs compared to APD counterparts in III-V material systems because of Si/Ge APD architectures are more compatible with CMOS technology. Si/Ge APD is therefore a promising candidate for price sensitive markets that require high sensitivity in the near infrared spectrum, such as optical links for server machines and consumer electronics.

High operating biases and high packaging costs remain an obstacle to such PICs however. Si/Ge APDs in the art often require significantly more than 12V and therefore are generally beyond the operating space of server machines, desktop computers, mobile devices, etc. Packaging of an APD can account for 70% of a receiver module. Many such module packaging schemes rely on edge coupling of optical fibers to waveguides leading to the APD. Depending on the dimensions of the waveguides, such active alignment is often inefficient and not amenable to high volume manufacturing.

BRIEF DESCRIPTION OF THE DRAWINGS

Embodiments of the present invention are illustrated by way of example, and not by way of limitation, and can be more fully understood with reference to the following detailed description when considered in connection with the figures in which.

DETAILED DESCRIPTION

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, optical, or electrical contact with each other, and/or that the two or more elements co-operate or interact with each other (e.g., as in a cause an effect relationship).

The terms "over," "under," "between," and "on" as used herein refer to a relative position of one component or material layer with respect to other components or layers where such physical relationships are noteworthy. For example in the context of material layers, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similar distinctions are to be made in the context of component assemblies.

Described herein are embodiments of a PIC including a low voltage APD disposed at an end of a waveguide extending laterally within a silicon device layer of a PIC chip. The APD is disposed over an inverted re-entrant minor co-located at the end of the waveguide to couple light by internal reflection from the waveguide to an under side of the APD. In exemplary embodiments, a 45°-55° facet is formed in the silicon device layer by crystallographic etch. In embodiments, the APD is a Si/Ge APD including a silicon multiplication layer, a germanium absorption layer over the multiplication layer. In embodiments, a plurality of ohmic contacts to one of the APD terminals are disposed over the absorption layer. In embodiments, an overlying optically reflective metal film interconnects the plurality of ohmic contacts and returns light transmitted around the ohmic contacts back to the absorption layer for secondary absorption and greater detector responsivity for a given detector bandwidth.

Figure 1A:
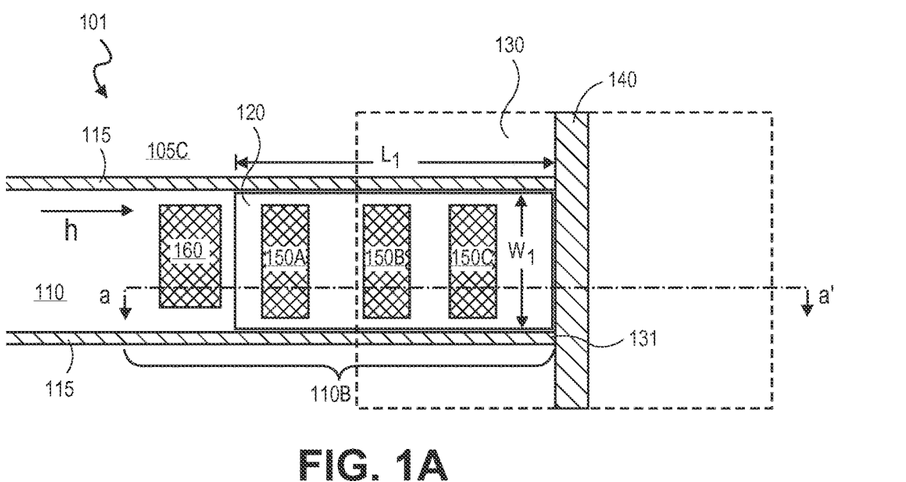
FIG. 1A is a plan view of a photonic integrated circuit (PIC) with a re-entrant minor (REM) waveguide coupled Si/Ge APD, in accordance with an embodiment of the present invention.

FIG. 1A is a plan view of a photonic integrated circuit (PIC) 101 with a re-entrant minor (REM) waveguide coupled Si/Ge APD, in accordance with an embodiment of the present invention. The PIC 101 includes an optical waveguide 110 extending laterally through a device layer of a substrate 105. The waveguide 110 terminates with a crystallographic end facet 130 that follows a crystal plane of the device layer. Generally, the end facet 130 is to serve as an inverted minor to redirect light laterally propagated by the waveguide upward to an underside (or backside) of a Si/Ge APD 120. In embodiments, the Si/Ge APD 120 includes layers epitaxially grown over the end of the waveguide 110 to achieve precise thickness and doping specifications that permit an ultra low operational voltage (e.g., ~8.5V, or less). Low voltage, and a high bandwidth-responsivity product is achieved, in part, by way of a top contact architecture that has good reflectivity within the band of radiation the APD is to detect (e.g., 1.3 µm, 1.5 µm, 850 nm, etc.).

Figure 1B:
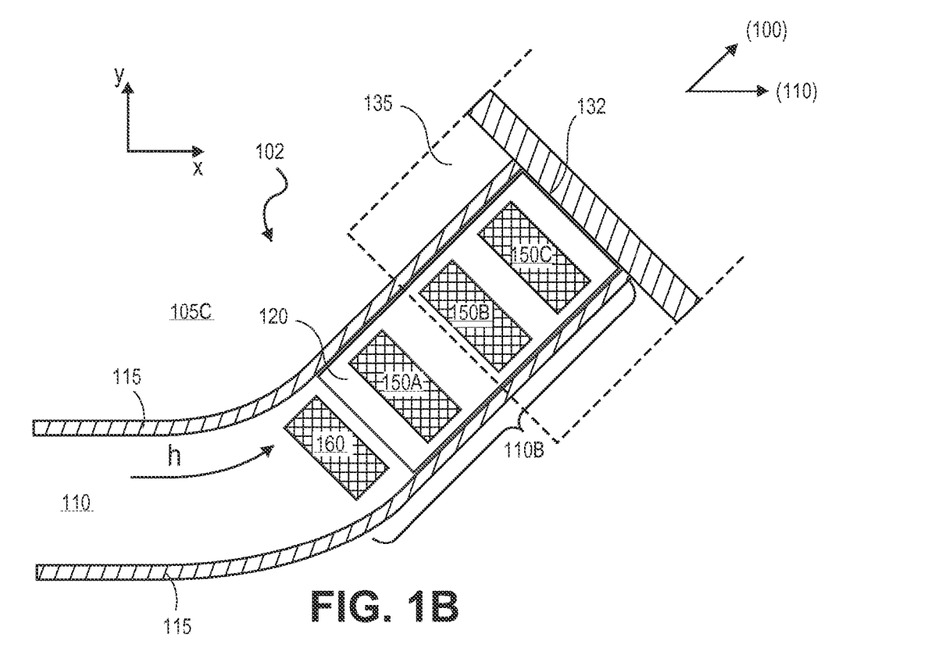
FIG. 1B is a plan view of a PIC with a REM waveguide coupled Si/Ge APD, in accordance with an embodiment of the present invention.
Figure 1C:
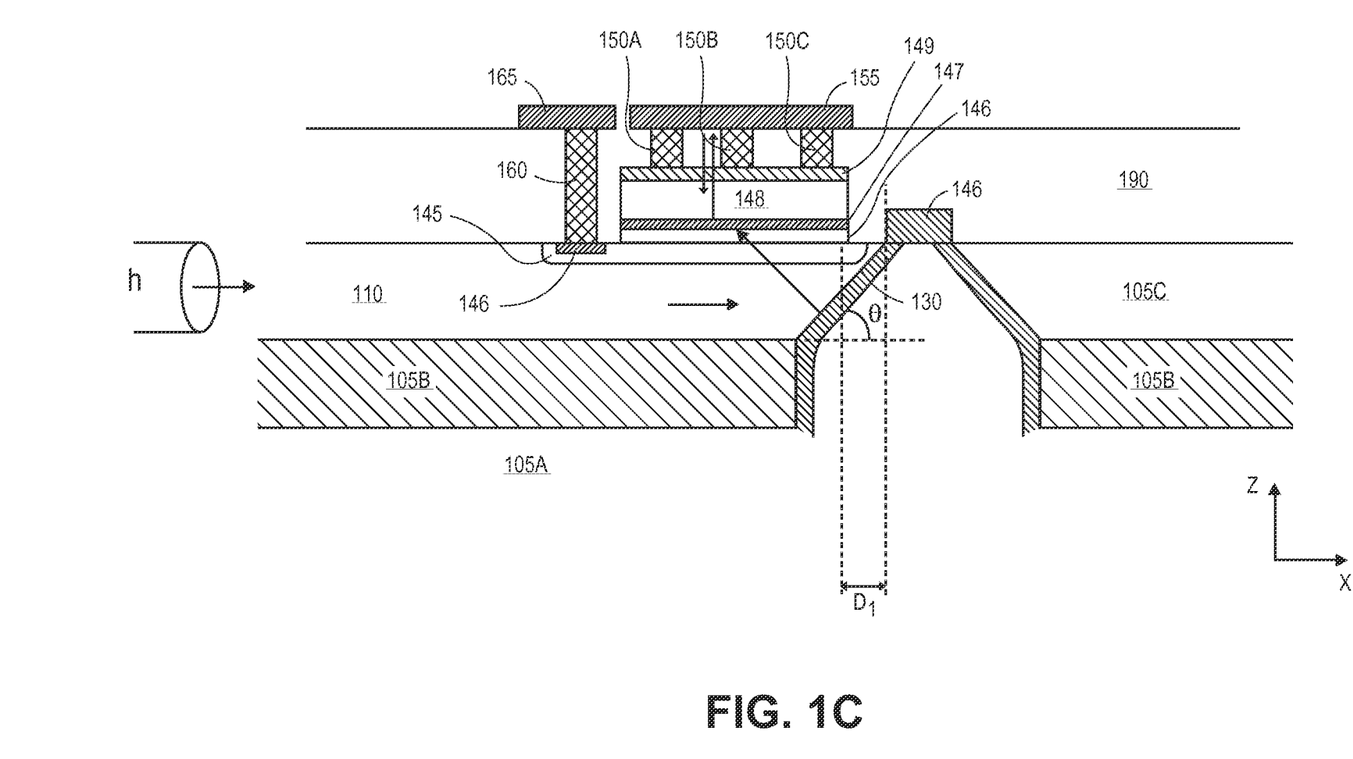
FIG. 1C is a cross-sectional view of the PIC depicted in FIG. 1A, in accordance with a silicon-on-insulator (SOI) embodiment of the present invention.
Figure 2A:
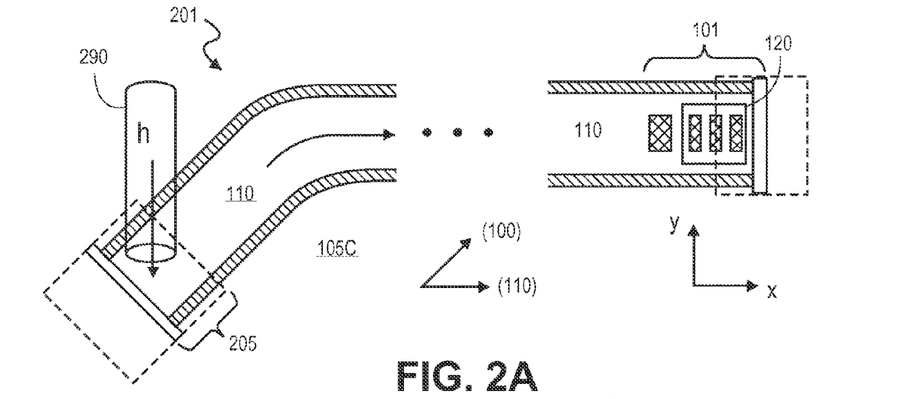
FIG. 2A is a plan view of a PIC with a REM waveguide coupled Si/Ge APD configured for top side illumination, in accordance with an embodiment.
Figure 2B:
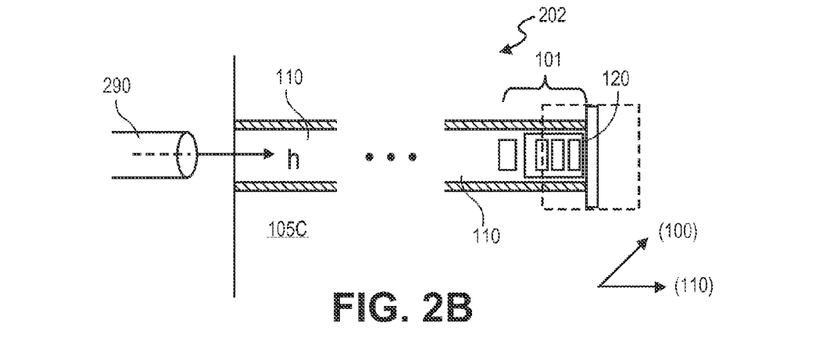
FIG. 2B is a plan view of a PIC with a REM waveguide coupled Si/Ge APD configured for edge illumination, in accordance with an embodiment.
Figure 2C:
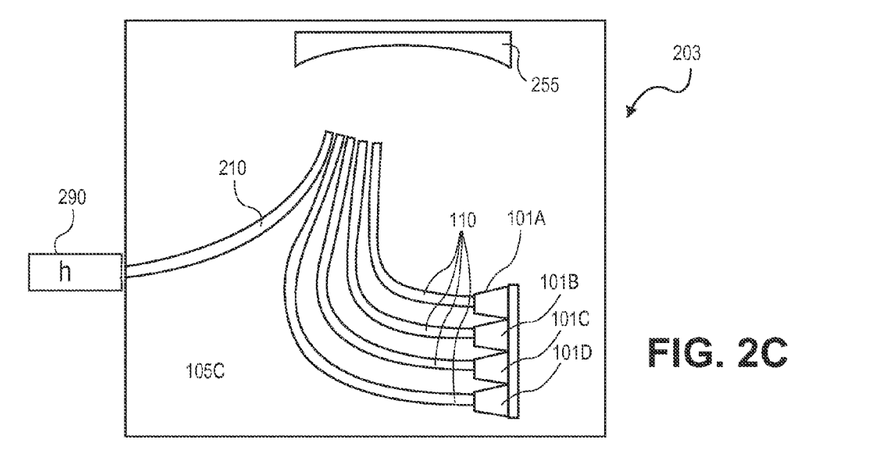
FIG. 2C is a plan view of a PIC with a REM waveguide coupled Si/Ge APD and an optical wavelength demultiplexer, in accordance with an embodiment.

A top mirror edge 131 is visible in FIG. 1A and is further visible as an edge of the mirror facet 130 in the cross-sectional view of FIG. 2C along the a-a' line illustrated in FIG. 1A. As illustrated in FIGS. 1A and 1C, the mirror facet 130 is a facet within the device layer 105C in which the waveguide 110 is formed, for example by patterning trenches 115 (FIG. 1A) to define a lateral route of optical mode propagation. Generally, the device layer 105C may be any crystalline semiconductor known in the art as being suitable for forming a waveguide. In the exemplary embodiments, the device layer 105C entails a substantially monocrystalline semiconductor having a cubic crystal lattice, which is diamond cubic in exemplary Si, Ge or SiGe embodiments. In embodiments, the device layer 105C has {100} crystallinity (or crystal orientation). As used herein, {100} crystallinity means a cubic crystal lattice is oriented with a [100] direction orthogonal to, or normal to, the top surface of the device layer 105C. In other words, the top surface is the (100) plane or a symmetrically equivalent plane (e.g., (001)). For silicon embodiments, the device layer 105C may therefore entail any <100> type silicon substrate, whether a bulk substrate, an epitaxially layer, or a bonded transferred layer. Cubic crystallinity and {100} orientation enables cyrstallographic etching the mirror facet 130 to follow a {111} crystal plane having a 54.7° angle relative to the substrate or top surface of the device layer 105C for the waveguide orientation depicted in FIG. 1A. The mirror facet 135 in FIG. 1B is on a {110} crystal plane of the device layer in the PIC 102 and is similarly etched to a 45° angle relative to the substrate or top surface of the device layer 105C for the alternate waveguide orientation depicted in FIG. 1B. In an alternate embodiment where the device layer has {110} crystallinity, the mirror facet 135 may be a crystalline facet on a {100} crystal plane of the device layer, which would also provide an inverted 45° mirror.

Disposed under the device layer 105C is a thin film dielectric layer 105B. Generally, the dielectric layer 105B may be any material known in the art to have sufficient index contrast with the waveguide 110 for mode confinement. In certain embodiments, the dielectric layer 105B is further to provide sufficient etch selectivity relative to the device layer 105C that the dielectric layer 105B may be undercut as a means of fabricating the mirror facet 130, as is described further elsewhere herein. In one embodiment with a silicon device layer 105C, the dielectric layer 105B comprises silicon oxide, and in the exemplary embodiment the dielectric layer 105B is silica ($SiO_2$). As shown in FIG. 2C, the dielectric layer 105B is recessed from the top minor edge 130 by an amount approximately equal to the thickness of the device layer 105C. For example where the thickness of the device layer $T_1$ is approximately 25 µm, the dielectric layer 105B is recessed laterally (along the x-dimension) from the top mirror edge 131 by approximately 25 µm.

The device layer 105C and the dielectric layer 105B are both disposed over a substrate 105A. The substrate 105A may be of any material known in the art, including, but not limited to, semiconductors or dielectrics, whether single crystalline, polycrystalline or glass. In one exemplary embodiment, the substrate 105A is single crystalline semiconductor, such as silicon. In the exemplary embodiment, a semiconductor on insulator (SOI) substrate is employed with the device layer 105C and substrate 105A each being silicon, and the dielectric layer 105B being silicon dioxide.

As further shown in FIGS. 1A and 1B, within an x-y plane the mirror facets 130, 135 are oriented orthogonally to the direction of light propagation in an end portion 110B of the optical waveguide 110, as defined by edges 131 and 132 etched into the device layer. In embodiments with {100} crystallinity, at least the end portion of the waveguide 110B optically coupled to the mirror facet 130 propagates light in the (110) direction while at least an end portion of the waveguide 110B optically coupled to the minor facet 135 propagates light in the (100) direction. Thus, depending on the embodiment, the waveguide 110 may include a 45° degree turn upstream of the end waveguide portion 110B. In the exemplary embodiment depicted in FIG. 1B, the waveguide 110 turns to accommodate a 45° deviation from a Manhattan layout (orthogonal polygons aligned to a substrate notch or flat) for the sake of forming the minor facet 135 with proper orientation relative to the substrate for the re-entrant minor end facet 135 to achieve a 45° relative to the top surface. However, an entire PIC with Manhattan layout may also be rotated 45° to the substrate notch to have all polygon feature dimensions parallel to the (110) direction.

As shown in FIG. 2C, the minor facet 130 is positioned with respect to the waveguide 110 to couple light out of the lateral plane of the waveguide 110 and into the APD 120 when there is sufficient index contrast between the device layer semiconductor (e.g., silicon) and a medium interfacing with the surface of the mirror facet 130 (e.g., vacuum or a dielectric such silica). In embodiments, the index contrast is sufficient for total internal reflection (TIR) at the mirror facet 130 leading to high coupling efficiency between the in-plane propagated light and the overlying APD 120. As illustrated in FIGS. 1A and 1B, the end facets 130, 135 are each a side of a recess etched into the device layer, the recesses each having a plurality of sides defined by a plurality of {110} or {100} crystal planes, and at least a portion of the mirror facets 130, 135 (represented by dashed lines in FIG. 1A and 1B) is recessed below a bottom surface of the APD 120.

In embodiments, the APD 120 has a length $L_1$ (parallel to direction of mode propagation within the waveguide 110) between 10 and 30 μm, and a width $W_1$ of 5-20 μm. Generally, referring again to FIG. 1C, the APD 120, and more specifically the absorption layer 148, is to be disposed proximate to the facet edge 131 with a spacing $D_1$ free to vary based, in part, on the thickness of the waveguide and corresponding dimensions of the optical mode, as well as the angle of reflection off the minor facet 130. For example, in certain embodiments employing a 45° minor end facet, distance between the end facet edge 132 and the APD 120 (analogous to distance $D_1$ in FIG. 1C) is minimized and nearly the entire length of the APD 120 is advantageously disposed over the end facet 135 to capture as much of the reflected optical mode (travelling orthogonally to the device layer surface) as possible with minimal detector area for lowest detector capacitance (highest bandwidth). In exemplary embodiments where the device layer 105C has a thickness of tens of microns (e.g., 20-30 μm), the optical waveguide 110 therefore has a z-height in the tens of microns (e.g., 20-30 μm). This large dimensioned waveguide enables relatively easy edge alignment compared to single-mode III-V waveguides with dimensions typically on the order of 3-5 μm. Furthermore, for a 25 μm tall waveguide, a 45° minor facet has a lateral recess, or undercut, of approximately 25 μm, such that the APD 120 may be disposed over a 25 μm end portion of the waveguide (e.g., 110B in FIG. 1B). The APD 120 may therefore have a square area of about 600 μm², although depending on waveguide dimensions and bandwidth requirements, substrate area occupied by the APD 120 may range from 100-1000 μm². In embodiments employing a 55° minor end facet, the spacing $D_1$ may be increased and only a portion of the length of the APD 120 disposed directly over the end facet 130. A remaining length of the APD 120 may be disposed over a region of the waveguide having the full thickness of the device layer 105C to capture as much of the reflected optical mode (travelling non-orthogonally to the device layer surface) as possible with minimal detector area for lowest capacitance (highest bandwidth). Notably, in embodiments employing a 55° minor end facet, index contrast between adjacent material layers in the APD 120, such as a Si—Ge layer interface, will serve to refract non-normal incident light escaping the device layer 105C to be more nearly orthogonal to the device layer surface as it passes through the absorption layer.

As further illustrated in FIGS. 1A, 1B, and 1C, an occlusion material 140 is disposed over and/or in the recess etched into the device layer 105C. The occlusion material 140 seals, or occludes, two opposites sides of the recess (one of which is the minor end facet 130), In the exemplary embodiments, the occlusion material has sufficient index contrast with the device layer 105C that TIR is maintained even where the occlusion material is disposed on the mirror facet 130. For example, in certain embodiments where the device layer 105C is silicon, at least a base layer of the occlusion material 140 is silica. As shown in FIG. 1C, the occlusion material 140 may or may not form a key hole or void within the device layer recess defining the end facet 130. The occlusion material 140 may be planar with the device layer top surface (e.g., as polished back after deposition).

In embodiments, the APD 120 is a Si/Ge separate absorption, charge and multiplication (SACM) low voltage avalanche photodiode (LVAPD). As with the lateral dimensions of the APD 120 relative to the mirror facet 130, the various layers and components of the APD 120 are not necessarily drawn to scale, but rather, they are illustrated to more clearly show each of the components.

The APD 120 includes an n-type doped silicon (n+ Si) layer 145 that is either deposited over the device layer 105C, or as depicted in FIG. 1C, embedded within the device layer 105C (i.e., a top portion of the device layer is doped, for example by any conventional implant process). A silicon i-layer 146 is disposed over (or on as is depicted) at least a portion of the n-type layer 145. The i-layer 146 is not intentionally doped and therefore has a low impurity concentration, advantageously no more than $5 \times 10^{15}$ cm$^{-3}$, and more advantageously significantly less than $5 \times 10^{15}$ cm$^{-3}$. In certain such embodiments, the thickness i-layer 146 is between 0.07 to 0.13 μm. In one advantageous embodiment, the thickness i-layer 146 is 100 nm. In embodiments, the i-layer 146 is epitaxial, meaning the crystallinity follows that of the underlying device layer 105C (i.e., seeded from the device layer 105C). The i-layer 146 may therefore be substantially monocrystalline, although a nominal level of growth defects are inevitable. Beyond good control of doping and crystallinity within the i-layer 146, tight control of the i-layer thickness is enabled through the epitaxial growth/deposition process. This thickness control, in turn, further enables a the APD 120 to be operational at low bias voltages (e.g. below 12V and advantageously below 8.5V).

Disposed over (or on) the i-layer 146, is a p-type doped silicon layer 147. Functionally, the n-type Si layer 145, the i-Si layer 146, and the p-type Si layer 147 serve to multiply charge carriers photogenerated in an overlying absorption region, for example through a sufficiently high field to induce avalanche multiplication within the i-layer 146. In embodiments, the thickness the p-type Si layer 147 is 15-25 nm and in one advantageous embodiment where the i-layer 146 is 100 nm, the p-type Si layer 147 is 20 nm. In certain such embodiments, the doping concentration of the p-type Si layer 147 is between $2 \times 10^{18}$ cm-3 to $3 \times 10^{18}$ cm-3. In embodiments, the p-type Si layer 147 is epitaxial with crystallinity following that of the underlying device layer 105C (as seeded by the i-layer 146). The p-type Si layer 147 may therefore be substantially monocrystalline. Beyond good control of doping and crystallinity with the p-type Si layer 147, tight control of the p-type Si layer thickness is enabled through the epitaxial growth/deposition process. This thickness control enables a the APD 120 to be operational at low bias voltages (e.g. below 12V and advantageously below 8.5V).

Disposed over (or on) the p-type Si layer 147 is a semiconductor absorption layer 148. In the exemplary embodiments, the absorption layer 148 is germanium that is not intentionally doped (i-Ge). In the exemplary embodiment the i-Ge layer 148 is disposed directly on the p-type Si layer 147. In the exemplary embodiment, the i-Ge layer 148 is epitaxial, following the crystallinity of the device layer 105C (as seeded by the p-type Si layer 147), and substantially monocrystalline, or at least of sufficient crystal quality for carrier lifetimes that are adequate for a particular absorption layer thickness. Thickness of the absorption layer 148 may vary based on responsivity requirements, generation efficiency at a particular wavelength, etc., because the operating voltage of the APD is more a function of the silicon layer thicknesses (e.g., 146 and 147). Disposed over the absorption layer 148 is a p-type doped semiconductor (e.g., p+ Ge) layer 149, to form a good ohmic contact with a contact metal. A functionally similar heavily doped (n+) silicon region 145 is also disposed within the n-type silicon layer 146. A dielectric passivation layer 190 is disposed over at least a portion of each of the p+ layer 149, the n-type doped silicon (n+ Si) layer 145, and the n-type silicon layer 146. At least one first metal contact 15A passes through the dielectric layer 190 and is electrically coupled to, or directly connected to, the p-type doped semiconductor layer 149 while a second metal contact 160 passes through the dielectric layer 190 to be electrically coupled to, or directly connected to, the n+ Si region 145.

In embodiments, a plurality of first metal contacts 150A, 150B, and 150C are disposed over, and electrically coupled to, the p-type doped semiconductor layer 149, with the dielectric material 190 disposed between adjacent ones of the first metal contacts. Having more than one metal contact allows individual contact size to be small while still providing adequately low contact resistance (e.g., by reducing effect of sheet resistance of layer 149) for sufficient detector bandwidth. Lateral spacing between the distributed contacts allows light unabsorbed by the absorption layer to transmit through the dielectric layer 190 (past or around the metal contacts 150A-150C, which in an embodiment have poor reflectivity within the operational band) at a substantially normal angle of incidence. In one embodiment, for example, the metal contacts 150A, 150B, 150C are tungsten, which provides a good ohmic contact to the p-type semiconductor layer 149, but has relatively poor reflectivity within the near infrared band.

As further depicted in FIG. 1C, a metal sheet 155 is disposed over the dielectric material 190 and extends continuously between, and electrically interconnects, the first metal contacts 150A, 150B, and 150C. In advantageous embodiments, the metal sheet 155 spans at least a majority of the area of the APD 120, or more particularly the area occupied by the absorption layer 148, is substantially planar to, or parallel with the top surface of the device layer 105C, and is of a metal having a good reflectivity (e.g., higher than that of the first metal contacts 150A-150C) within the wavelength band that the APD 120 is to operate. For example, where the APD 120 is operational in the near infrared band (e.g., 1.3 μm), the metal sheet 155 is copper, which has high reflectivity in the near infrared. As illustrated by the ray trace arrows in FIG. 1C, a portion of the optical energy reflected to the APD 120 by the mirror end facet 130 that is not initially absorbed as it passeses through the thickness of the absorption layer 148 transmits through the dielectric layer 190 (around/between the metal contacts 150A-150C) to be reflected back by the planar metal sheet 155, and through the dielectric layer 190 for a second pass through the germanium absorption layer 148. This architecture therefore is advantageous for both low contact resistance to the Si/Ge APD 120 and higher responsivity for a given thickness of the germanium absorption layer 148.

Completing the APD 120 is a a second metal contact 160 that is coupled to the n-type silicon region 146 (e.g., through the heavily doped region 145). In embodiments, this second ohmic n-contact is disposed adjacent to a side of the APD stack (e.g., a i-layer 146, the p-type silicon layer 147, absorption layer 148, etc.) that is opposite the end facet 130. This location for the metal contact 160 permits the spacing $D_1$ between APD 120 and the end facet 130 to remain small and independent of n-contact transfer lengths, etc. This location for the second contact metal 160 also permits the absorption layer 148 to occupy a full width of the waveguide 110 (e.g., y-dimension in FIG. 1A). An interconnect metallization (e.g., copper) 165 is further disposed on the contact metal 160, maintaining planarity with the metal sheet 155.

In embodiments, the optical waveguide 110 is edge-coupled to a optical fiber input or is vertically coupled. FIG. 2A is a plan view of a PIC 201 with a vertical coupler 205 configured to receive top side/vertically coupled illumination, in accordance with an embodiment. As shown, the PIC 201 includes the PIC 101, as previously described, disposed at one terminus of the waveguide 110 propagating light in the (110) direction with the APD 120 is disposed over a 54.7° end facet. At the end opposite the APD, the waveguide 110 makes a 45° turn to propagate light in the (100) direction. In embodiments, the vertical coupler 205 includes a second REM facet, substantially as previously described in the context of the PIC 101, however the mirror end facet is sloped at 45° (a {110} crystal plane) to best couple an incident fiber 290 that is orthogonally aligned to the device layer surface. In the embodiment illustrated in FIG. 2A therefore, two REM facets are at opposite ends of a waveguide to enable a top-side fiber input illumination of the APD 120 (although the APD 120 is actually illuminated through a back side of the APD stack by the REM waveguide coupling). In such embodiments, the backside of the substrate 105 may remain free of optical interconnects, which may be advantageous for packaging, board-level interconnects, through via architectures (e.g., 3D IC), etc. Notably, while the PIC 102 exemplifies how the APD 120 and the vertical coupler 205 may be disposed on a mirror end facets of a different re-entrant angles (crystal planes), either of the APD 120 or coupler 205 can be oriented to match the other such that the same crystal plane may be employed both for vertically coupling input fiber to the waveguide 110 and optically coupling the waveguide 110 to the APD 120.

FIG. 2B is a plan view of a PIC 202 with a REM waveguide coupled Si/Ge APD configured for edge illumination, in accordance with an embodiment. With the large dimensions of the waveguide 110 (e.g., 25 μm) edge illumination embodiments can be packaged into modules with much greater efficiency and/or lower cost than PICs employing smaller waveguide dimensions (e.g., single-mode III-V waveguides). As shown in FIG. 2B, one end of the waveguide 110 is cleaved at an edge of the PIC chip. The cleaved facet is then aligned to receive input from the fiber 290. At the opposite end of the waveguide 110 is the PIC 101, including the APD 120 disposed over a REM.

In further embodiments, a PIC including a REM waveguide coupled Si/Ge APD includes one or more active or passive optical components, such as, but not limited to, a wavelength de-multiplexer. FIG. 2C is a plan view of a PIC 203 with a plurality of REM waveguide coupled Si/Ge APDs and an optical wavelength de-multiplexer 255, in accordance with an embodiment. As shown, at each of the first ends of a plurality of waveguides 110 is a PIC (101A, 101B, 101C, 101D), each of which includes a Si/Ge APD disposed over a REM, for example as described in the context of FIGS. 1A-1C. The optical wavelength de-multiplexer 255 is then disposed at an end of the waveguides 110 opposite the REM end facets. While the optical wavelength de-multiplexer 255 may be of any architecture known in the art, the exemplary embodiment illustrates an etched waveguide Echelle diffraction grating, which is well-suited to the exemplary SOI substrate employed by the PIC 101. The Echelle diffraction grating is further optically coupled to a second waveguide 210, which in turn is edge-coupled to an input fiber in the illustrated embodiment, but may also be vertically coupled, for example as described in the context of FIG. 2A.

Figure 3A:
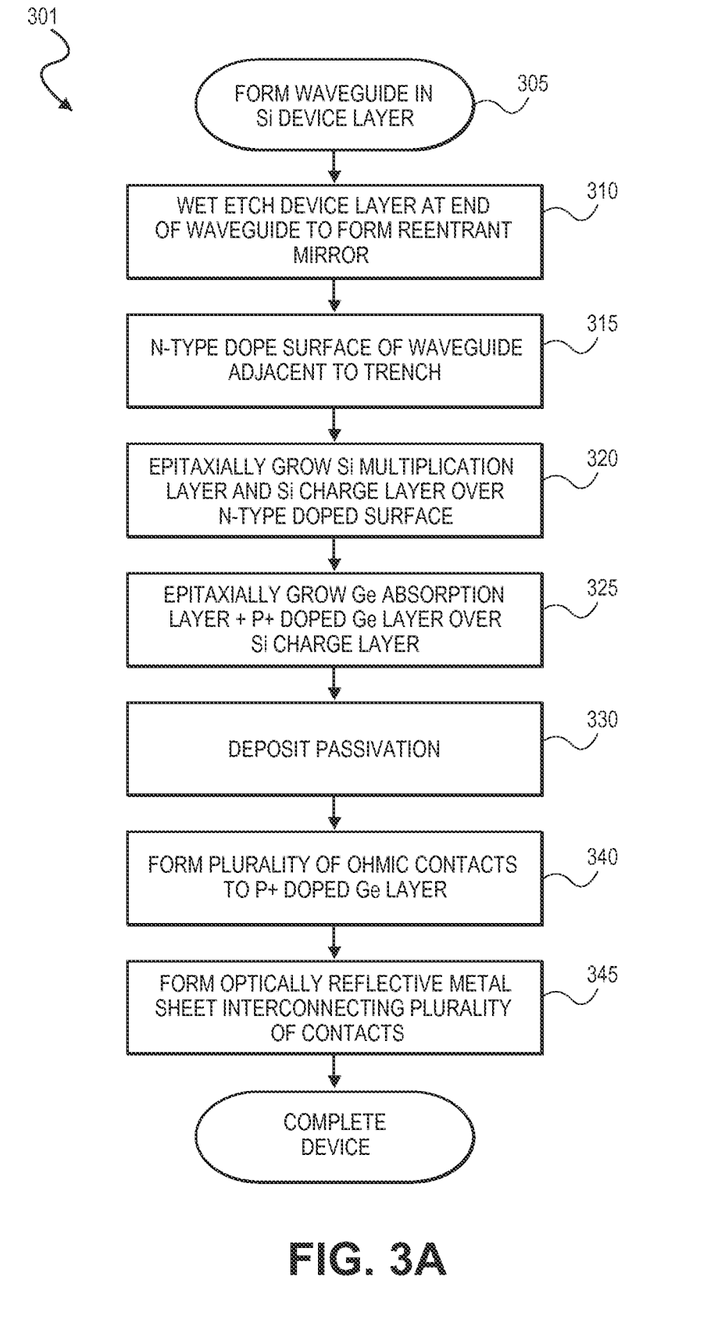
FIGS. 3A and 3B are flow diagrams illustrating methods of fabricating a PIC with a REM coupled Si/Ge APD.
Figure 3B:
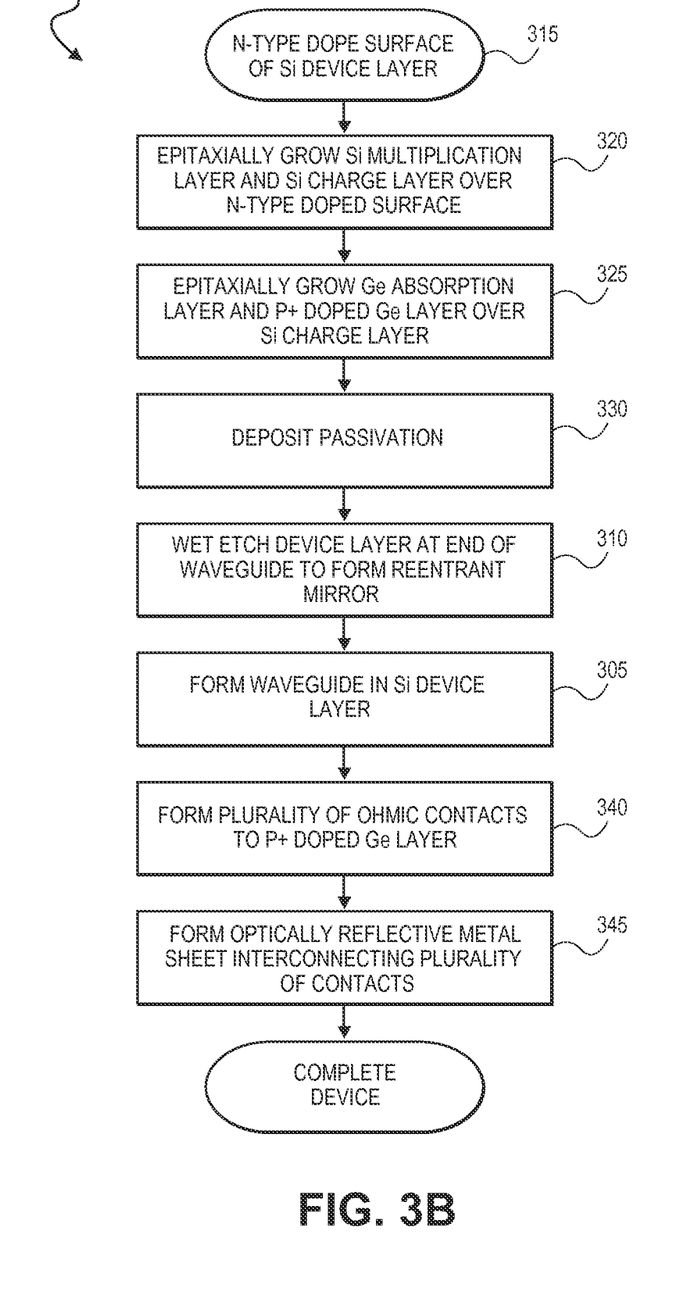

FIGS. 3A and 3B are flow diagrams illustrating methods of fabricating a PIC with a REM coupled Si/Ge APD. Generally, the method 301 in FIG. 3A is a bottom-up process beginning the waveguide and REM formation while the method 302 in FIG. 3B is a top-down process beginning with APD stack formation. These two exemplary methods are described as alternate embodiments to highlight the many techniques which may be utilized to form the REM coupled Si/Ge APD architectures described elsewhere herein.

Referring first to FIG. 3A, the method 301 begins with forming a waveguide in the semiconductor device layer (e.g., silicon) disposed over a thin film dielectric layer (silica) with any anisotropic etching process at operation 305. At operation 310, the device layer at the end of the waveguide is crystallographically etched to form the re-entrant mirror facet oriented 45°-55° from a surface of the device layer. In embodiments, the re-entrant mirror etch entails etching a trench into the device layer, orthogonal to an end portion of the waveguide. The thin film dielectric layer disposed below the device layer that is exposed by the trench is then etched so as to undercut the device layer a desired amount. A wet crystallographic semiconductor etchant, such as, but not limited to, KOH and isopropyl alcohol (IPA)) is then used to expose slow etching crystal planes in the device layer.

Continuing with FIG. 3A, at operation 315 a top surface of the end portion of the waveguide is doped n-type by conventional implant process. Alternatively, an in-situ epitaxial silicon layer may be grown on the top surface of the waveguide. At operation 320 the silicon i-layer and p-type layers (e.g., 146, 147 in FIG. 1C) are grown with an epitaxial process, or with a CVD/anneal process. At operation 325, the germanium absorption layer is epitaxially grown (e.g., 148 1C). The heavily doped p-type germanium layer (e.g., 149 in FIG. 1C) is then deposited or epitaxially grown on the absorption layer. At operation 330, a dielectric passivation layer, such as silica, silicon nitride, silicon-oxynitride, etc. is deposited over the APD stack.

At operation 340, at least one, and advantageously a plurality of contacts, is electrically coupled to the n-type device layer and the germanium (p-type) layer. In the exemplary embodiment, a plurality of openings are etched through the dielectric layer to expose separate regions of the heavily doped semiconductor layer. A contact metal, such as, but not limited to tungsten, is deposited into each of the plurality of openings to contact the heavily doped semiconductor layer. At operation 345, the contact metal is interconnected with a planar reflective second metallization, such as, but not limited to copper, that forms a continuous sheet over an area that is approximately equal to the area of the waveguide covered by the germanium absorption layer, and planar to the absorption layer. At least one contact is made to the n-type silicon layer by doping a portion of the n-type doped device layer to a higher dopant concentration (e.g., n+). An opening on a side of the germanium layer opposite the end facet is then etched through the dielectric layer to expose the more heavily doped region of the n-type device layer, and the contact metal (e.g., tungsten) is deposited into the opening. The PIC is then completed through conventional processing.

Referring now to FIG. 3B, the method 302 begins with n-type doping the surface of the device layer at operation 315. The silicon i-layer (multiplication layer) and silicon p-type layer (charge layer) are then epitaxially grown over the n-type doped region of the device layer at operation 325. The method 302 then proceeds with deposition of the dielectric passivation layer at operation 330. With the APD layers protected, the waveguide is formed into the device layer at operation 305, in alignment with the various layers of the APD already formed. The crystallographic REM etch operation 310 is then performed in alignment with the waveguide and the APD. APD contacts are then made at operation 340, followed by the reflective metal interconnect at operation 345. The PIC is then completed through conventional processing.

Figure 4:
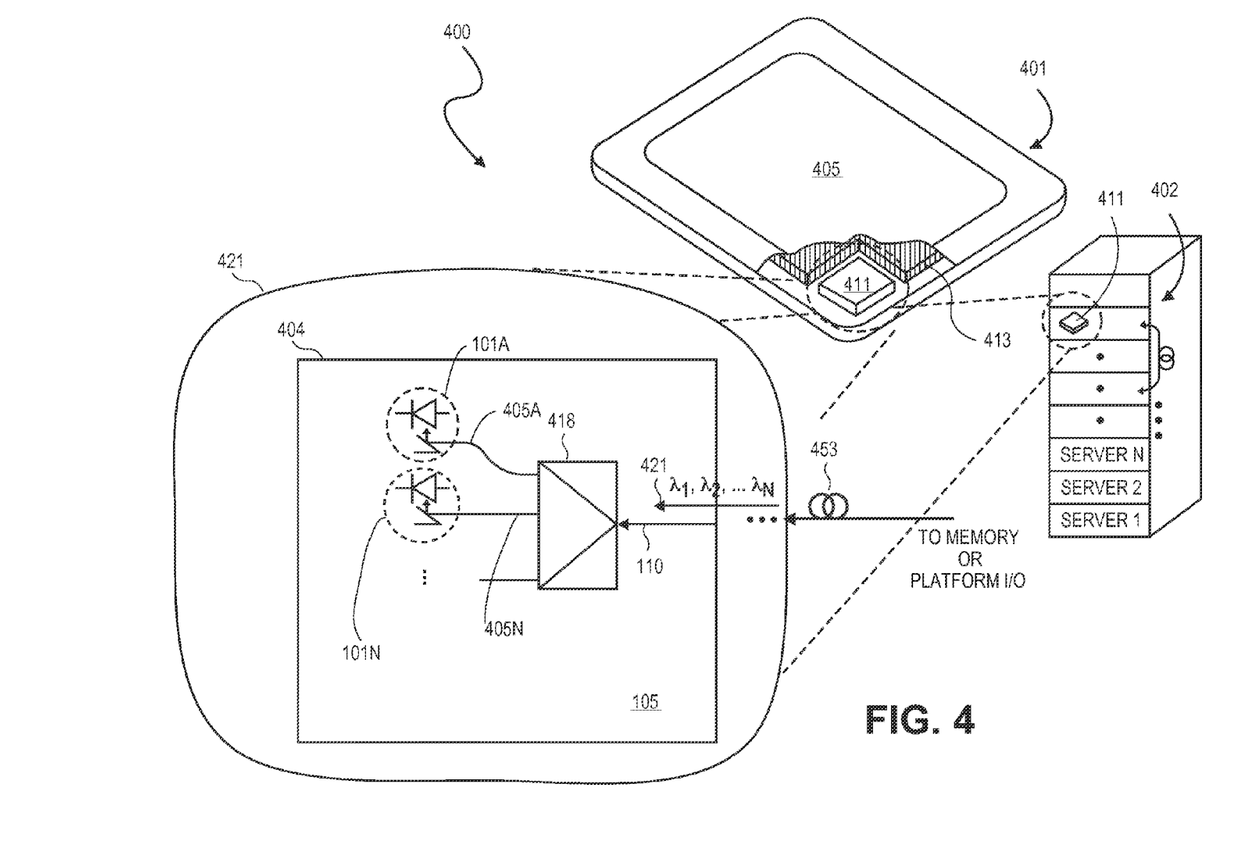
FIG. 4 is functional block diagram of an optical receiver module including a PIC with a REM waveguide coupled Si/Ge APD disposed in a mobile computing platform or a data server machine, in accordance with embodiments of the present invention.

FIG. 4 is functional block diagram of an electronic device 400 including an optical receiver module 411 utilizing a PIC 404 with a REM waveguide coupled Si/Ge APD, in accordance with embodiments of the present invention. In the illustrated embodiments, the optical receiver module 411 is a component in either a consumer electronic device, such as the mobile computing platform 401, a desktop computer, etc., or in a data server machine 402. Generally, the mobile computing platform 401 may be any portable device configured for each of electronic data display, electronic data processing, and wireless electronic data transmission. For example, the mobile computing platform 401 may be any of a laptop, a netbook, a notebook, an ultrabook, a tablet, a smart phone, etc. and includes a display screen 405, which may be a touchscreen (e.g., capacitive, resistive, etc.) the optical receiver module 411, and a battery 413. The sever machine 302 may be any data processing platform, such as those employed in commercial data centers throughout the world.

The receiver module 411 is further illustrated in the expanded functional block view 421. The optical wire 453 inputs a single optical beam 421, which is optically coupled into the waveguide 210, for example by top side coupling or edge coupling substantially as describe elsewhere herein. Selected wavelengths are then separated with an optical demultiplexer 418 to output to a plurality of optical waveguides 405A-405N disposed on a substrate 105. The plurality of optical waveguides 405A-405N are each further coupled into a PIC 101A-101N, each of which includes a REM coupled Si/Ge APD, which are in turn electrically coupled to downstream integrated circuitry. In embodiments, the receiver module 411 includes one or more of the features described for one or more embodiments of the PIC 101, or PIC 102.

Figure 5:
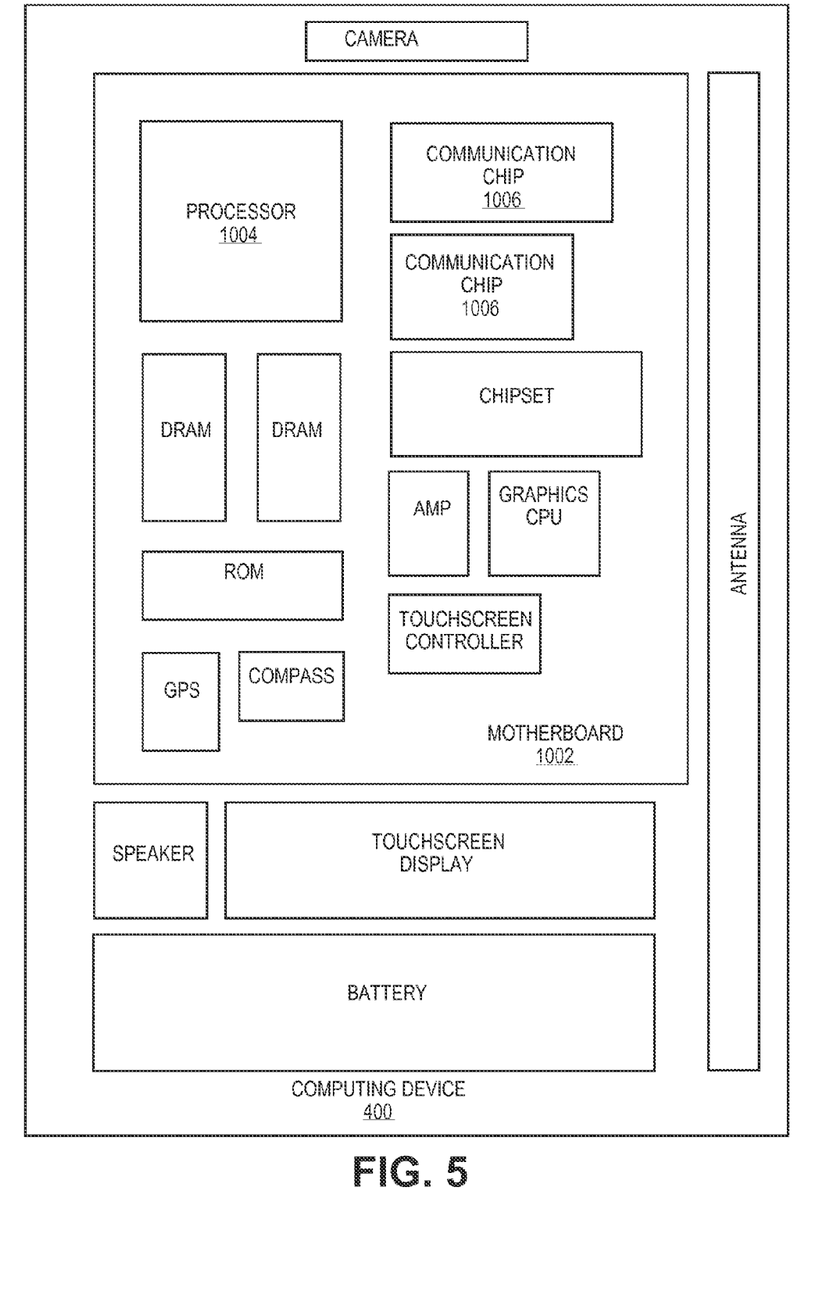
FIG. 5 is a functional block diagram of an electronic device illustrated in FIG. 4, in accordance with an embodiment of the present invention.

FIG. 5 is a functional block diagram of the a computing device 400 in accordance with certain embodiments of the invention. The computing device 400 may be disposed in the mobile computing platform 401 or server machine 402 and may further include a number of components, including but not limited to a processor 1004 (e.g., an applications processor) and at least one communication chip 1006. The processor 1004 is physically and electrically coupled to a board 1002. In some implementations the at least one communication chip 1006 is also physically and electrically coupled to the board 1002. In further implementations, the communication chip 1006 is part of the processor 1004. Depending on its applications, mobile computing device 400 may include other components on the board 1002. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid state drive (SSD), compact disk (CD), digital versatile disk (DVD), and so forth).

At least one of the communication chips 1006 enables wireless communications for the transfer of data to and from the mobile computing platform 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 includes an integrated circuit die packaged within the processor 1004. The term "processor" may refer to any device or portion of a device that processes electronic data from registers and/or memory to transform that electronic data into other electronic data that may be stored in registers and/or memory. In embodiments, one or more of the communications chip 1006 or processor 1004 incorporates the a REM waveguide coupled APD, substantially as described elsewhere herein. Of course, any other integrated circuit chips employing optical waveguides may similarly incorporate a REM waveguide coupled APD, substantially as described in one or more embodiments elsewhere herein.

It is to be understood that the above description is intended to be illustrative, and not restrictive. For example, while flow diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims.

For example, in embodiments, a photonic integrated circuit (PIC), comprises an optical waveguide extending laterally in a crystalline silicon device layer and terminating at an end facet that is re-entrant from a top surface of the device layer; and an avalanche photodiode (APD) disposed over the waveguide, the APD including an n-type silicon region embedded in, or disposed on, the device layer; a silicon i-layer disposed over the n-type silicon region; a p-type silicon layer disposed over the i-layer; a crystalline germanium layer disposed over the p-type silicon layer; and a p-type doped semiconductor layer disposed over the germanium layer, wherein at least a portion of the re-entrant end facet is recessed below at least a portion of the n-type silicon layer.

In further embodiments, the APD further comprises a plurality of first metal contacts disposed over, and electrically coupled to, the p-type doped semiconductor layer, wherein a dielectric material is disposed between adjacent ones of the first metal contacts; and a metal sheet disposed over the dielectric material and extending continuously between, and electrically interconnecting, the first metal contacts.

In further embodiments, the metal sheet spans at least a majority of the area of the APD and is of a metal having a higher reflectivity than that of the first metal contacts within the wavelength band of the APD.

In further embodiments, the end facet has an index contrast with an interfacing material sufficient for the crystal plane to induce internal reflection of an optical mode propagated by the waveguide and redirect the mode into the germanium layer, and the metal sheet has sufficient reflectivity to reflect light back through the germanium layer.

In further embodiments, a second metal contact is coupled to the n-type silicon region and disposed adjacent to a side of the p-type silicon layer opposite the end facet.

In further embodiments, the device layer is 10-30 µm thick, is disposed over a thin film dielectric layer, and has {100} crystallinity, wherein a {100} or {110} crystal plane of the device layer forms the end facet, and wherein the i-layer is 0.07-0.13 µm thick.

In further embodiments, the end facet is one side of a recess etched into the device layer, the recess having a plurality of sides defined by a plurality of {110} or {100} crystal planes.

In further embodiments, at least majority of the APD is disposed directly over the recess etched end facet.

In further embodiments, the p-type Si layer is about 20 nm thick with a doping concentration between about $2 \times 10^{18}$ cm-3 to $3 \times 10^{18}$ cm-3, and wherein the i-layer is 70-130 nm thick and with a doping concentration no more than $5 \times 10^{15}$ cm-3.

In further embodiments, the waveguide further comprises a second end facet that is also re-entrant from a top surface of the device layer, wherein a {110} crystal plane of the device layer forms the second end facet.

In embodiments, an electronic device comprises a processor; a memory; and an optical receiver module chip communicatively coupled to at least one of the processor and the memory, wherein the optical receiver module further comprises a photonic integrated circuit (PIC), the PIC comprising an optical waveguide disposed in a crystalline silicon device layer of a substrate; and an avalanche photodiode (APD) disposed over a crystallographic re-entrant end facet of the optical waveguide, wherein the APD includes an n-type silicon region embedded in, or disposed on, the device layer with at least a portion of the re-entrant end facet recessed below at least a portion of the n-type silicon layer.

In further embodiments, the APD further comprises a silicon i-layer disposed over the n-type silicon region, the i-layer being between 90 and 110 nm thick and with a doping concentration no more than $5 \times 10^{15}$ cm; a p-type silicon layer disposed over the i-layer, the p-type Si layer being between 15 and 25 nm thick with a doping concentration between about $2 \times 10^{18}$ cm-3 to $3 \times 10^{18}$ cm-3; a crystalline germanium layer disposed over the p-type silicon layer; and a p-type doped semiconductor layer disposed over the germanium layer, wherein a portion of the re-entrant end facet is disposed below a portion of the germanium layer.

In further embodiments, the APD further comprises a plurality of first metal contacts disposed over, and electrically coupled to, the p-type doped semiconductor layer, wherein a dielectric material is disposed between adjacent ones of the first metal contacts; and a metal sheet disposed over the dielectric material and extending continuously between, and electrically interconnecting, the first metal contacts.

In further embodiments, the device layer is 10-30 μm thick, disposed over a thin film dielectric layer, and has {100} crystallinity; a {100} or {110} crystal plane of the device layer forms the end facet, and the PIC further comprises a wavelength de-multiplexer optically coupled to an end of the waveguide opposite the end face.

In further embodiments, the PIC further comprises a second waveguide optically coupled the wavelength de-multiplexer, wherein the second waveguide is edge coupled to an optical input fiber, the second waveguide lacking a re-entrant end facet.

In embodiments, a method of forming a minor in a photonic integrated circuit (PIC), the method comprises forming an optical waveguide in a crystalline semiconductor device layer disposed over a thin film dielectric layer of a substrate; crystallographically etching an end of the waveguide to form a facet in the device layer oriented 45°-55° from a surface of the device layer; doping a top surface of the device layer n-type at the end of the waveguide; epitaxially growing a silicon i-layer and a silicon p-type layer using the n-type doped device layer as a seeding surface; epitaxially growing a germanium layer and a p-type germanium layer over the silicon p-type layer; and forming contacts electrically coupled to the n-type device layer and the germanium layer.

In further embodiments, crystallographically etching further comprises:
etching a trench through the device layer; etching the thin film dielectric layer exposed by the trench to undercut the device layer; and wet etching the device layer to expose a {100} or {110} crystal plane.

In further embodiments, forming contacts further comprises: forming a heavily doped semiconductor layer over the germanium layer; depositing a dielectric layer over the heavily doped semiconductor layer; etching a plurality of openings through the dielectric layer to expose separate regions of the heavily doped semiconductor layer; depositing a contact metal into the plurality of openings to contact the heavily doped semiconductor layer; and interconnecting the contact metal with a second metallization that is continuous over an area that is approximately equal to the area of the waveguide covered by the germanium layer.

In further embodiments, forming contacts further comprises doping a portion of the n-type doped device layer to a higher dopant concentration; etching an opening through the dielectric layer to expose the more heavily doped region of the n-type device layer, the opening on a side of the germanium layer opposite the end facet; and depositing the contact metal into the opening.

In further embodiments, the end facet has an index contrast with an interfacing material sufficient for the crystal plane to induce internal reflection of an optical mode propagated by the waveguide and redirect the mode into the germanium layer, and wherein the metal sheet has sufficient reflectivity to reflect light back through the germanium layer.

The scope of the invention should, therefore, be determined with reference to the appended claims, along with the full scope of equivalents to which such claims are entitled.

What is claimed is:

1. A photonic integrated circuit (PIC), comprising:
an optical waveguide extending laterally in a crystalline silicon device layer and terminating at an end facet that is re-entrant from a top portion of the device layer;
a dielectric layer disposed over the device layer; and
an avalanche photodiode (APD) comprising
an n-type doped region embedded within the top portion of the device layer;
a silicon i-layer disposed over the n-type doped region;
a p-type silicon layer disposed over the i-layer;
a crystalline germanium layer disposed over the p-type silicon layer; and
a p-type doped semiconductor layer disposed over the germanium layer, wherein at least a portion of the re-entrant end facet is recessed below at least a portion of the embedded n-type doped region, wherein the APD futher comprises
a plurality of first metal contacts disposed over, and electrically coupled to, the p-type doped semiconductor layer, wherein the dielectric layer is disposed between adjacent ones of the first metal contacts; and
a metal sheet disposed over the dielectric layer and extending continuously between, and electrically interconnecting, the first metal contacts, wherein the metal sheet spans at least a majority of the area of the APD and is of a metal having a higher reflectivity than that of the first metal contacts within the wavelength band of the APD.

2. The PIC of claim 1, wherein the end facet has an index contrast with an interfacing material sufficient for the crystal plane to induce internal reflection of an optical mode propagated by the waveguide and redirect the mode into the germanium layer, and wherein the metal sheet has sufficient reflectivity to reflect light back through the germanium layer.

3. The PIC of claim 1, further comprising a second metal contact coupled to the n-type doped region and disposed adjacent to a side of the p-type silicon layer opposite the end facet.

4. The PIC of claim 1, wherein the device layer is 10-30 µm thick, is disposed over a thin film dielectric layer, and has {100} crystallinity, wherein a {100} or {110} crystal plane of the device layer forms the end facet, and wherein the i-layer is 0.07-0.13 µm thick.

5. The PIC of claim 4, wherein the end facet is one side of a recess etched into the device layer, the recess having a plurality of sides defined by a plurality of {110} or {100} crystal planes.

6. The PIC of claim 4, wherein at least majority of the APD is disposed directly over the recess etched end facet.

7. The PIC of claim 4, wherein the p-type Si layer is about 20 nm thick with a doping concentration between about $2\times10^{18}$ cm$^{-3}$ to $3\times10^{18}$ cm$^{-3}$, and wherein the i-layer is 70-130 nm thick and with a doping concentration no more than $5\times10^{15}$ cm$^{-3}$.

8. The PIC of claim 1, wherein the waveguide further comprises a second end facet that is also re-entrant from the top portion of the device layer, wherein a {110} crystal plane of the device layer forms the second end facet.

9. The PIC of claim 1, wherein the dielectric layer is disposed on at least a portion of each of the p-type doped semiconductor layer, the n-type doped region, and the silicon i-layer.

10. The PIC of claim 1, wherein the APD is disposed over the waveguide forming a spacing between the APD and the end facet.

11. The PIC of claim 10, wherein a size of the spacing depends at least on one of a thickness of the waveguide and an angle of the end facet.

12. The PIC of claim 1, wherein the silicon i-layer has a crystallinity that follows a crystallinity of the device layer.

13. The PIC of claim 1, wherein the p-type silicon layer has a crystallinity that follows a crystallinity of the silicon i-layer.

14. A photonic integrated circuit (PIC), comprising:
an optical waveguide extending laterally in a crystalline silicon device layer and terminating at an end facet that is re-entrant from a top portion of the device layer;
a dielectric layer disposed over the device layer; and
an avalanche photodiode (APD) comprising
an n-type doped region embedded within the top portion of the device layer;
a silicon i-layer disposed over the n-type doped region;
a p-type silicon layer disposed over the i-layer;
a crystalline germanium layer disposed over the p-type silicon layer; and
a p-type doped semiconductor layer disposed over the germanium layer, wherein at least a portion of the re-entrant end facet is recessed below at least a portion of the embedded n-type doped region, wherein the p-type silicon layer has a crystallinity that follows a crystallinity of the device layer; and an occlusion layer to seal opposite sides of the recess.

15. A photonic integrated circuit (PIC), comprising:
an optical waveguide extending laterally in a crystalline silicon device layer and terminating at an end facet that is re-entrant from a top surface of the device layer;
a dielectric layer disposed over the device layer;
an avalanche photodiode (APD) disposed over an n-type doped region of a top portion of the device layer, the APD including
a silicon i-layer disposed over the n-type doped region;
a p-type silicon layer disposed over the i-layer;
a crystalline germanium layer disposed over the p-type silicon layer; and
a p-type doped semiconductor layer disposed over the germanium layer, wherein at least a portion of the re-entrant end facet is recessed below at least a portion of the n-type doped region;
a plurality of first metal contacts disposed over, and electrically coupled to, the p-type doped semiconductor layer, wherein a dielectric material is disposed between adjacent ones of the first metal contacts,
a metal sheet disposed over the dielectric material and extending continuously between, and electrically interconnecting, the first metal contacts; and
a second metal contact coupled to the n-type doped region and disposed adjacent to a side of the p-type silicon layer opposite the end facet,
wherein the second metal contact passes through the dielectric layer to couple to a more heavily doped portion of the n-type doped region.

* * * * *